United States Patent
Lin et al.

(10) Patent No.: US 9,930,280 B2
(45) Date of Patent: Mar. 27, 2018

(54) IMAGING PIXEL SUBARRAY WITH SHARED PULSE DETECTION

(71) Applicant: Sensors Unlimited, Inc., Princeton, NJ (US)

(72) Inventors: Minlong Lin, Plainsboro, NJ (US); Joshua Lund, Dallas, TX (US)

(73) Assignee: Sensors Unlimited, Inc., Princeton, NJ (US)

( * ) Notice: Subject to any disclaimer, the term of this patent is extended or adjusted under 35 U.S.C. 154(b) by 0 days.

(21) Appl. No.: 14/987,524

(22) Filed: Jan. 4, 2016

(65) Prior Publication Data
US 2017/0195600 A1    Jul. 6, 2017

(51) Int. Cl.
| | | |
|---|---|---|
| *H04N 3/14* | (2006.01) | |
| *H04N 5/335* | (2011.01) | |
| *H04N 5/378* | (2011.01) | |
| *H01L 27/146* | (2006.01) | |
| *H04N 5/369* | (2011.01) | |
| *H04N 5/357* | (2011.01) | |

(52) U.S. Cl.
CPC ......... *H04N 5/378* (2013.01); *H01L 27/1463* (2013.01); *H04N 5/357* (2013.01); *H04N 5/3696* (2013.01)

(58) Field of Classification Search
CPC ................ H04N 5/3745; H04N 5/3765; H01L 27/14609; H01L 27/14643; G01S 17/023; G01S 7/4804; G01S 7/4863
See application file for complete search history.

(56) References Cited

U.S. PATENT DOCUMENTS

| | | | |
|---|---|---|---|
| 7,616,231 | B2 | 11/2009 | Farrier |
| 7,830,437 | B2 | 11/2010 | McKee et al. |
| 2002/0036765 | A1 | 3/2002 | McCaffrey et al. |
| 2002/0109072 | A1 | 8/2002 | Lowrance et al. |
| 2003/0205663 | A1 | 11/2003 | Boubal et al. |
| 2012/0261553 | A1 | 10/2012 | Elkind et al. |
| 2012/0305786 | A1* | 12/2012 | Dierickx ................... G01J 1/44 250/371 |

FOREIGN PATENT DOCUMENTS

EP    2874388 A1    5/2015

OTHER PUBLICATIONS

Extended European Search Report for European Patent Application No. 16207522.0, dated May 18, 2017.

* cited by examiner

*Primary Examiner* — Kelly L Jerabek
(74) *Attorney, Agent, or Firm* — Locke Lord LLP; Scott D. Wofsy; Judy R. Naamat

(57) ABSTRACT

An imaging and pulse detection (IPD) pixel array includes a plurality of imaging pixels arranged in a plurality of rows and columns. Each imaging pixel includes a respective photodetector that outputs signals in response to incident light and input laser pulses. The signals include imaging signals that correspond to the incident light and pulse signals that correspond to the input laser pulses. The IPD array further includes an isolation circuit associated with each of the respective imaging pixels, each isolation circuit outputting filtered output pulse signals in response to receiving the signals from the associated imaging pixel, the filtered output pulse signals corresponding to the pulse signals. The IPD array further includes a single pulse detection circuit that toggles between a charged and uncharged state corresponding to a pulse being received from at least one of the isolation circuits.

24 Claims, 5 Drawing Sheets

IMAGING PIXEL SUBARRAY WITH SHARED PULSE DETECTION

BACKGROUND OF THE INVENTION

1. Field of the Invention

The present invention relates to an imaging pixel array, and more particularly to an imaging pixel array having shared pulse detection.

2. Description of Related Art

A conventional imaging pixel array of a focal plane array can include imaging pixels that output image signals in response to detection of incident light and pulse detection pixels that output an output pulse signal in response to detection of an input pulse, such as a laser pulse. The focal plane arrays further require external control or timing to synchronize operation of the image detection and pulse detection pixels. Such conventional methods and systems have generally been considered satisfactory for their intended purpose. However, there is still a need in the art to reduce the size of the focal plane array and reduce complexity of timing control and synchronization of image and pixel detection in different pixels. The present disclosure provides a solution for these problems.

SUMMARY OF THE INVENTION

The purpose and advantages of the below described illustrated embodiments will be set forth in and apparent from the description that follows. Additional advantages of the illustrated embodiments will be realized and attained by the devices, systems and methods particularly pointed out in the written description and claims hereof, as well as from the appended drawings.

To achieve these and other advantages and in accordance with the purpose of the illustrated embodiments, in one aspect, an imaging and pulse detection (IPD) array is provided. In accordance with an aspect of the disclosure the imaging and pulse detection array includes a plurality of imaging pixels arranged in a plurality of rows and columns. Each imaging pixel includes a respective photodetector. The photodetector outputs signals in response to incident light and input laser pulses. The signals include imaging signals corresponding to the incident light and pulse signals corresponding to the input laser pulses. The IPD array further includes an isolation circuit associated with each of the respective imaging pixels. Each isolation circuit outputs filtered output pulse signals in response to receiving the signals from the associated imaging pixel, wherein the filtered output pulse signals correspond to the pulse signals. The IPD array further includes a single pulse detection circuit that toggles between a charged and uncharged state in response to a filtered output pulse signal corresponding to a pulse being received from at least one of the isolation circuits.

In embodiments, the pulse detection circuit can include at least one storage device that stores a charge when in a charged state, wherein the storage device can output the stored charge in response to a single row selection pulse. The pulse detection circuit can include at least one storage device that stores a charge when in a charged state, wherein the charge can be reset to a predetermined state from the storage device in response to a reset signal. The pulse detection circuit can include at least a portion of an amplifier that amplifies filtered output pulse signals received from the isolation circuits.

At least one of the isolation circuits can include a driver device associated with the amplifier. The driver devices associated with the respective isolation circuits can be coupled in a parallel relationship relative to one another. Each of the isolation circuits can include a high-pass filter that applies a filter to the signal output by the associated imaging pixel to obtain the filtered output pulse signal that corresponds to the pulse signals. The pulse detection circuit can include a single current source to provide a steady current to the at least a portion of the amplifier.

In accordance with another aspect of the disclosure, an imaging device is provided that includes a focal plane array having a plurality of IPD arrays.

In accordance with a further aspect of the disclosure, a method of processing incident light and input pulse signals by an imaging pixel array is provided. The method includes outputting signals in response to incident light and input laser pulses sensed by respective photodetectors of a plurality of imaging pixels arranged in a plurality of rows and a plurality of columns. The signals include imaging signals corresponding to the incident light and pulse signals corresponding to the input laser pulses. The method further includes filtering the signals output by the imaging pixels and outputting filtered pulse signals that correspond to the pulse signals. The method further includes toggling between a charged state and an uncharged state of a storage device in response to a filtered output pulse signal corresponding to a pulse being received from at least one of the isolation circuits. The method further includes reading out a current state of the storage device.

In embodiments, the stored charge can be output in response to a single row selection pulse. The stored charge can reset to a predetermined state in response to a reset signal. The method can further comprise amplifying the output pulse signals output from the respective imaging pixels, wherein respective amplifications are performed in parallel to one another.

These and other features of the systems and methods of the subject disclosure will become more readily apparent to those skilled in the art from the following detailed description of the exemplary embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, exemplary embodiments thereof will be described in detail herein below with reference to certain figures, wherein.

DETAILED DESCRIPTION

Figure 1:
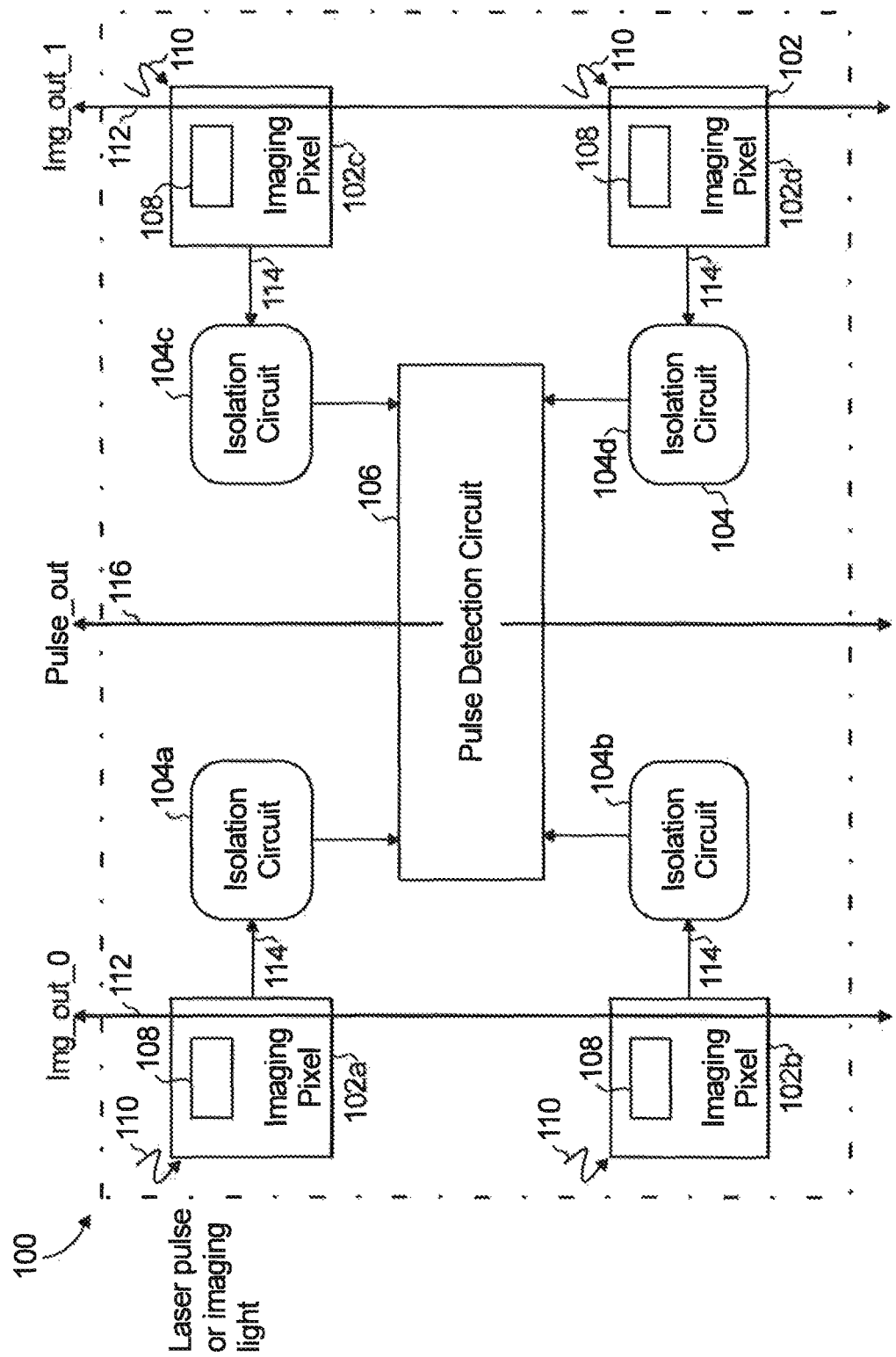
FIG. 1 is a block diagram of an exemplary embodiment of an imaging and pulse detection (IPD) array in accordance with embodiments of the present disclosure.

Reference will now be made to the drawings wherein like reference numerals identify similar structural features or aspects of the subject disclosure. For purposes of explanation and illustration, and not limitation, a block diagram of an exemplary embodiment of an imaging-pulse detection (IPD) pixel array in accordance with the disclosure is shown in FIG. 1 and is designated generally by reference character 100. Other embodiments of IPD arrays in accordance with the disclosure, or aspects thereof, are provided in FIGS. 2-5, as will be described.

Embodiments of the disclosure are directed to embodiments of IPD array 100 having imaging pixels that share pulse detection circuitry, and methods of processing input imaging signals and input pulse signals by the IPD array 100 using the imaging pixels and shared pulse detection circuitry.

Figure 2:
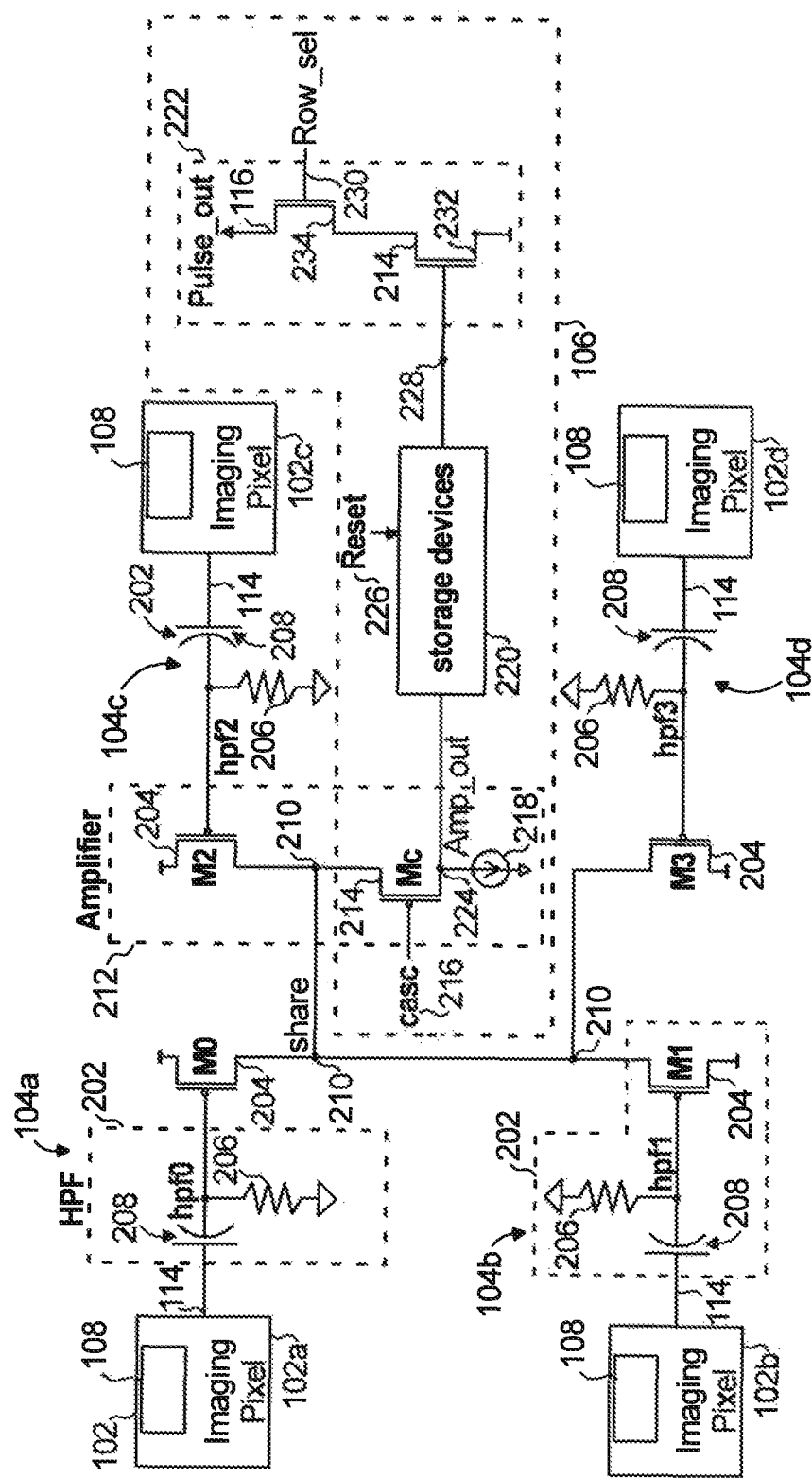
FIG. 2 is schematic diagram of the IPD array shown in FIG. 1.

The IPD pixel array 100 shown in FIGS. 1 and 2 includes a plurality of imaging pixels 102, isolation circuits 104 associated with the respective imaging pixels 102, and a single pulse detection circuit 106. While the IPD array 100 is shown with four imaging pixels 102a-102d arranged as a 2×2 array with respective associated isolation circuits 104a-104d, the IPD array 100 can include two or more imaging pixels 102 with associated isolation circuits 104 arranged in a plurality of rows and columns. The imaging pixels 102 are any pixels configured with an imaging architecture that generates imaging and pulse information, such as buffered direct injection (BDI) or capacitive transimpedance amplifier (CTIA) imaging pixels. Each imaging pixel 102 includes a photodetector 108. The photodetector 108 detects incident light associated with an incoming excitation signal 110, which can be either imaging light or a laser pulse. In response to the incident light, the photodetector outputs a signal via image signal paths 112 (e.g., img_out_0, img_out_1) and a pulse signal path 114 (e.g., pulse_out). The signal output along pulse signal path 114 is processed by the associated isolation circuit 104. Output from the isolation circuit 104 is processed by the pulse detection circuit 106. The pulse detection circuit outputs a pulse_out signal along pulse output path 116.

With reference to FIG. 2, the IPD array 100 is shown without image signal paths 112, and rather shows circuitry for processing the signals output via pulse signal path 114. In an example embodiment shown, the isolation circuit 104 associated with each imaging pixel 102 includes, as indicated by the dotted box designating isolation circuit 104b, a high pass filter 202 and a driver 204 (designated as M0-M3). The high pass filter 202, as indicated by the dotted box designating the high pass filter 202 of isolation circuit 104a, can be an RC filter including a resistor 206 and a capacitor 208 that are configured to block low frequency signals (e.g., image signals that are in response to imaging light of excitation signal 110) and pass high frequency signals that are in response to the input laser pulse of excitation signal 110. The output from each of the isolation circuits 104 exits at an associated node 210. Each node 210 is coupled to the pulse detection circuit 106.

The driver 204 can be a transistor, such as a MOSFET transistor. In the example shown, each of the drivers 204 are PMOS transistors in which the output from the corresponding high pass filter 202 is provided to a gate of the driver 204, a source of the driver 204 is tied to a power supply, and a drain of the driver 204 is coupled to the corresponding node 210. The drivers 204 associated with the respective isolation circuits 104 are coupled in a parallel relationship relative to one another.

In the example embodiment shown, the pulse detection circuit 106 includes a cascode transistor 214 (designated as Mc) that receives a bias signal 216 (designated as casc) at its gate, a current source 218, at least one storage device 220, and row select circuit 222. The bias signal 216 can be provided by an external source (not shown) as a fixed DC bias voltage that can operate as a control signal. The cascode device 214 controlled by signal 216 at a fixed DC bias, if properly chosen, will set the voltage of shared node 210 and provide better isolation from the disturbance at node 210 to the common storage device 220. In addition, cascode transistor 214 can increase the amplification factor for driver 204 and increase the sensitivity of the pulse detection circuit 106.

When a signal is output from one of the isolation circuits 104 at the corresponding node 210, the corresponding driver 204 operates together with the cascode transistor 214 to form an amplifier 212, as designated by the corresponding dotted box labeled 212.

In the example embodiment shown, the cascode transistor 214 is a MOSFET transistor, here shown as a PMOS transistor that is coupled at its drain (e.g., at node 224, designated as Amp_out) to current source 218, and at its source to node 210. Current source 218 provides a steady current. The current source 218 can include, for example, a transistor, to provide the steady current. Node 224 is coupled to the storage devices 220.

Cascode transistor 214 is optionally included. In an embodiment in which the cascode transistor 214 is omitted, node 210 can be connected directly to the storage devices 220.

The row select circuit 222, as shown in the example embodiment, includes a first transistor 232 having a gate coupled to node 228, and a second transistor 234 coupled to the first transistor 232 so that the first and second transistors 232 and 234 are coupled at the drain of transistor 232 and the source of transistor 234. Pulsed row_sel signal 230 can be applied to a gate of the second transistor 234 to cause the contents of the storage devices 220 to be read out as a pulsed output signal pulse_out when the row_sel signal 230 pulse is applied to the gate of the second transistor 234. Reading out the contents or charge of the storage devices includes outputting a signal that indicates the charged state of the storage devices 220 at the time that they are read out. Accordingly, the output signal is output along pulse output path 116, which is coupled to a drain of the second transistor 234, as a pulsed signal.

The first and second transistors 232 and 234 can be MOSFET transistors, such as NMOS transistors, as shown in the example embodiment. The first and second transistors 232 and 234 can alternately be PMOS transistors. As understood by a person skilled in the art, the IPD array 100 can be configured so that driver 204, cascode transistor 214 are, for example, NMOS transistors, and first and second transistors 232 and 234 are PMOS transistors, with coupling of the components of the circuits configured accordingly.

In operation, when an imaging pixel 102 of the IPD 100 senses incident light or an input laser pulse, one or more corresponding signals are transmitted via one of image signal paths 112 and via pulse signal path 114. The signals submitted via image signal paths 112 are processed by signal processing circuitry, timing circuitry, and image processing circuitry (not shown) for generating one or more frames of image data that can be displayed as an image or a series of images (e.g., video). Any combination of one or more of the imaging pixels 102a-102d can output signals at the same time that correspond to detected incident light. The signal processing circuitry, timing circuitry, and image processing circuitry can process all of these signals in order to output the frames of image data.

The signals transmitted via any of pulse signal path 114 are processed by the corresponding isolation circuits 104. The isolation circuits 104a-104d can operate simultaneously to filter out signals that do not correspond to input laser pulse signals and provide these filtered signals to node 210. Any signal that arrives at node 210 can be processed immediately by the amplifier 212 and submitted to the storage devices 220. Each time the storage devices 220 receive a pulse signal from node 224, the storage devices 220 are charged and or discharged, causing them to change from the predetermined state to an opposite state or toggle to an opposite high or low state relative to its current state.

Storage devices 220, which can include, for example, one or more transistors, are periodically reset to a predetermined state (e.g., high or low) in response to reset signal 226. Additionally, storage devices 220 are coupled at node 228 to row select circuit 222 for outputting a signal stored by the storage devices in response to a row_sel signal 230 that is applied as a pulse to the row select circuit 222.

When the reset signal is applied to the storage devices 220 the storage devices 220 are set to a predetermined state (which can be high or low). When the row_sel signal 230 is applied, the current state of the storage devices 220 is read out and transmitted as a corresponding high or low signal along pulse output path 116. Embodiments of storage devices 220 can include a switch for reset signal 226, a high impedance device to isolate current source 218, a capacitor, either physical or parasitic, and an optional leakage mitigation device to preserve the charges in the storage devices 220 before being reset.

Figure 3:
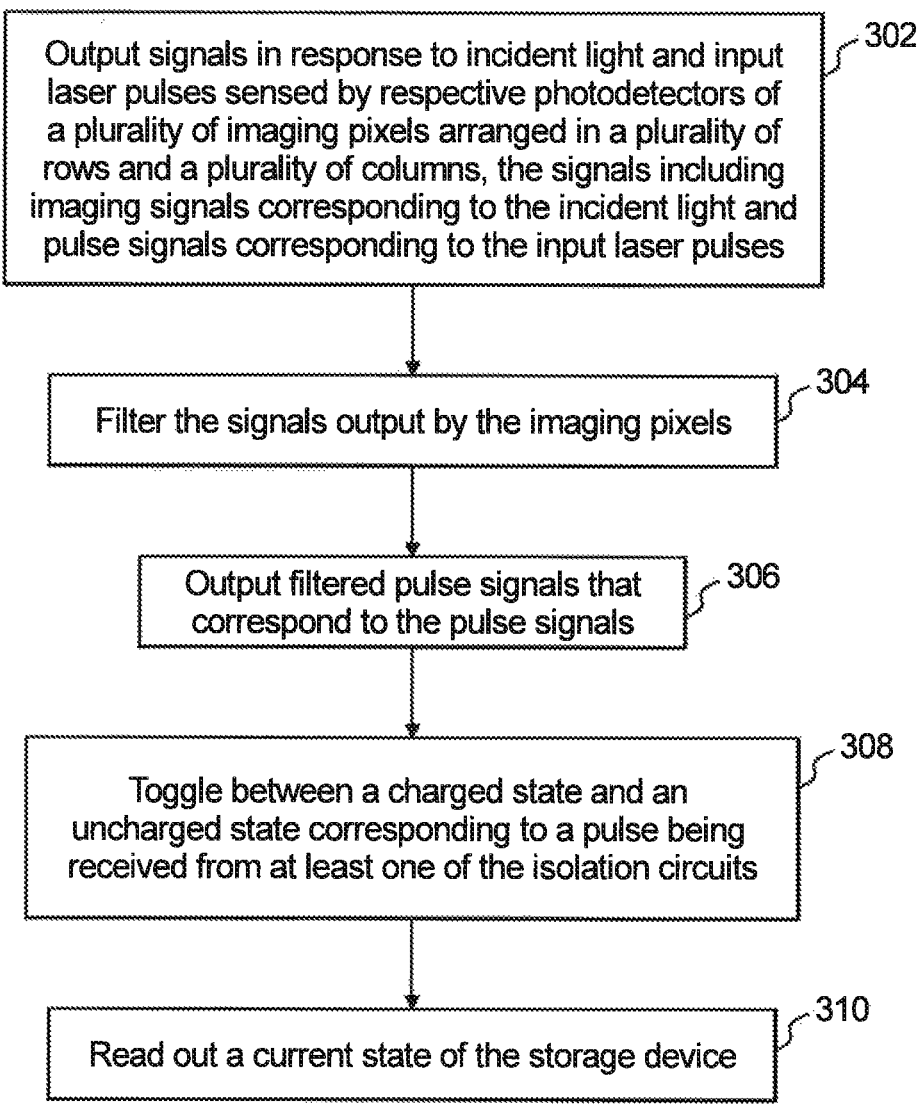
FIG. 3 is flowchart of operations performed by the IPD array shown in FIG. 1.

With reference now to FIG. 3, shown is a flowchart demonstrating implementation of the various exemplary embodiments. It is noted that the order of operations shown in FIG. 3 is not required, so in principle, the various operations may be performed out of the illustrated order. Also certain operations may be skipped, different operations may be added or substituted, or selected operations or groups of operations may be performed in a separate circuit following the embodiments described herein.

At operation 302, signals are output in response to incident light and input laser pulses sensed by respective photodetectors of a plurality of imaging pixels that are arranged in a plurality of rows and a plurality of columns. The signals include imaging signals corresponding to the incident imaging light and pulse signals corresponding to the input laser pulses.

At operation 304, the signals output by the imaging pixels are filtered. At operation 306, filtered pulse signals that correspond to the pulse signals are output.

At operation 308, a charged state or uncharged state of a storage device is toggled corresponding to a pulse being received from at least one of the isolation circuits.

At operation 310, a current state of the storage device is readout.

Figure 4:
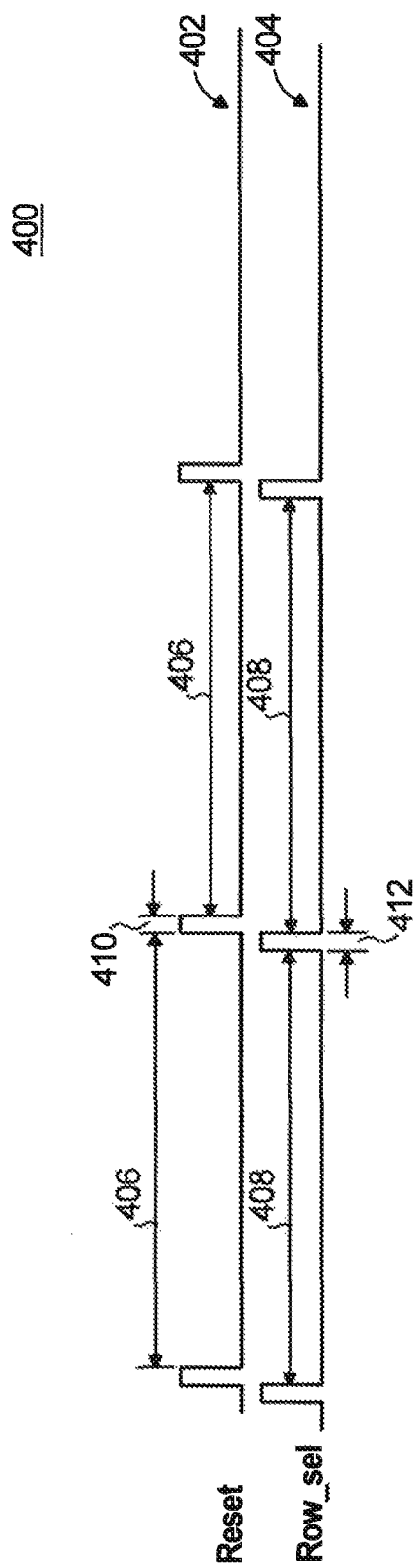
FIG. 4 is a timing diagram of reset and row_sel signals applied to the IPD array shown in FIG. 1.

FIG. 4 shows a timing diagram 400 that includes a plot 402 of reset signal 226 and a plot 404 of row_sel signal 230. Reset signals 226 and row_sel signals 230 are both pulses that occur at intervals. Intervals 406 occur between reset signals 226, and intervals 408 occur between row_sel signals 230. In the example embodiment shown intervals 406 and intervals 408 are both regular intervals and are equal to one another. In other embodiments, the intervals 406 and/or 408 can be irregular intervals. Furthermore, in embodiments intervals 406 and 408 can be unequal to one another. During time period 410 a reset signal pulse occurs, during which the state of the storage devices 220 is reset to a predetermined state, which can be a high or low charge. During time period 412 a row_sel signal pulse occurs, during which the current state of the storage devices 220 is read out. The time periods 410 and 412 are shown in the example embodiment to be equal, however in embodiments these time periods can be unequal to one another.

Advantageously, timing control is unneeded from the time that the imaging pixels 102 detect incident light or input laser pulses until a signal arrives at the storage devices 220. The only timing controls provided are the reset signal 226 and the row_sel signal 230.

The IPD array 100 thus includes imaging pixels 102 that output both imaging signals via image signal paths 112 and pulse signals via pulse output path 116. The components of pulsed detection circuit 106 are shared by the imaging pixels of the IPD array 100, including a single cascode transistor 214, current source 218, set of storage devices 220, and row select circuit 222. Incident imaging light can be detected by any combination of the imaging pixels 102 of the IPD array 100. Laser pulses can be applied to the imaging pixels 102 individually. If laser pulses are applied to multiple imaging pixels, only one pulse_out signal is output along pulse output path 116 per frame, wherein the frame extends from the beginning (e.g., rising edge) of one row_sel signal to the beginning of the next row_sel signal.

Figure 5:
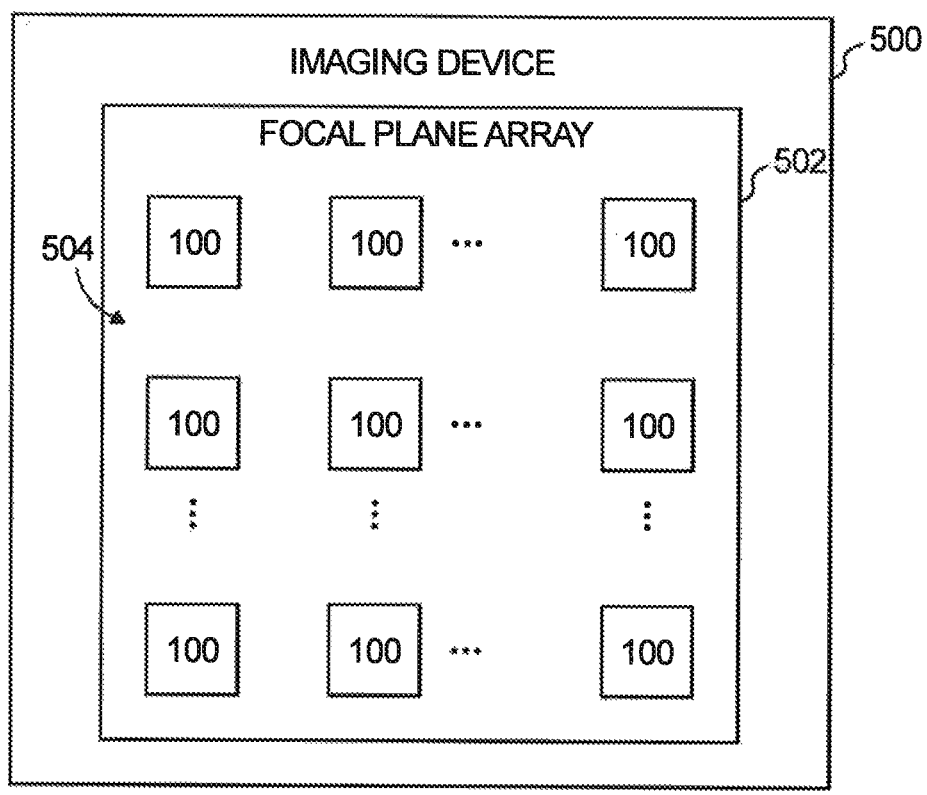
FIG. 5 is a block diagram of an imaging device that includes a plurality of the IPD arrays shown in FIG. 1.

With reference now to FIG. 5, an imaging device 500 is illustrated that includes a focal plane array 502 (e.g., a readout integrated circuit (ROIC)) have an array of IPD arrays 100 arranged on a substrate 504. The imaging device 500 can further include optics, row and column drivers, decoders, signal processing circuits, and image processing circuits (not shown). Further, the imaging device 500 can include one or more processing devices (not shown) that execute stored programmable instructions to control and/or perform functions of the imaging device 500.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An imaging pixel array comprising:
   a plurality of imaging pixels arranged in a plurality of rows and columns, each imaging pixel having a respective photodetector, the photodetector outputting signals in response to incident light and input laser pulses, the signals including imaging signals corresponding to the incident light and pulse signals corresponding to the input laser pulses;
   an isolation circuit associated with each of the respective imaging pixels, each isolation circuit outputting filtered output pulse signals in response to receiving the signals from the associated imaging pixel, the filtered output pulse signals corresponding to the pulse signals; and
   a single pulse detection circuit receiving output from at least two of the respective isolation circuits that changes between a charged and uncharged state corresponding to a pulse being received from any of the at least two isolation circuits.

2. The imaging pixel array of claim 1, wherein the pulse detection circuit includes a storage device that stores a charge when in a charged state, wherein the storage device outputs the stored charge in response to a single row selection pulse.

3. The imaging pixel array of claim 1, wherein the pulse detection circuit includes a storage device that stores a charge when in a charged state, wherein the charge is reset to a predetermined state from the storage device in response to a reset signal.

4. The imaging pixel array of claim 1, wherein the pulse detection circuit includes at least a portion of an amplifier that amplifies filtered output pulse signals received from the isolation circuits.

5. The imaging pixel array of claim 4, wherein at least one of the isolation circuits includes a driver device associated with the amplifier.

6. The imaging pixel array of claim 5, wherein the driver devices associated with the respective isolation circuits are coupled in a parallel relationship relative to one another.

7. The imaging pixel array of claim 1, wherein each of the isolation circuits includes a high-pass filter that applies a filter to the signal output by the associated imaging pixel to obtain the filtered output pulse signal that corresponds to the pulse signals.

8. The imaging pixel array of claim 1, wherein the pulse detection circuit includes a single current source to provide a steady current to the at least a portion of the amplifier.

9. The imaging pixel array of claim 1, wherein the single pulse detection circuit received the output from the at least two of the respective isolation circuits via a single node.

10. The image pixel array of claim 1, wherein the imaging pixel outputs the imaging signals from the imaging pixel via an imaging path.

11. An imaging device having a focal plane array that includes an imaging pixel array, the imaging pixel array comprising:
    a plurality of imaging pixels arranged in a plurality of rows and columns, each imaging pixel having a respective photodetector, the photodetector outputting signals in response to incident light and input laser pulses, the signals including imaging signals corresponding to the incident light and pulse signals corresponding to the input laser pulses;
    an isolation circuit associated with each of the respective imaging pixels, each isolation circuit outputting filtered output pulse signals in response to receiving the signals from the associated imaging pixel, the filtered output pulse signals corresponding to the pulse signals; and
    a single pulse detection circuit receiving output from at least two of the respective isolation circuits that changes between a charged and uncharged state corresponding to a pulse being received from any of the at least two isolation circuits.

12. The imaging device of claim 11, wherein the pulse detection circuit includes a storage device that stores a charge when in a charged state, wherein the storage device outputs the stored charge in response to a single row selection pulse.

13. The imaging device of claim 11, wherein the pulse detection circuit includes a storage device that stores a charge when in a charged state, wherein the charge is reset to a predetermined state in response to a reset signal.

14. The imaging device of claim 11, wherein the pulse detection circuit includes at least a portion of an amplifier that amplifies filtered output pulse signals received from the isolation circuits.

15. The imaging device of claim 14, wherein at least one of the isolation circuits includes a driver device associated with the amplifier.

16. The imaging device of claim 15, wherein the driver devices associated with the respective isolation circuits are coupled in a parallel relationship relative to one another.

17. The imaging device of claim 11, wherein each of the isolation circuits includes a high-pass filter that applies a filter to the signal output by the associated imaging pixel to obtain the filtered output pulse signal that corresponds to the pulse signals.

18. The imaging device of claim 11, wherein the pulse detection circuit includes a single current source to provide a steady current to the at least a portion of the amplifier.

19. The imaging device of claim 11, wherein the single pulse detection circuit receives the output from the at least two of the respective isolation circuits via a single node.

20. A method for processing incident light and input pulse signals by an imaging pixel array, the method comprising:
    outputting signals in response to incident light and input laser pulses sensed by respective photodetectors of a plurality of imaging pixels arranged in a plurality of rows and a plurality of columns, the signals including imaging signals corresponding to the incident light and pulse signals corresponding to the input laser pulses;
    filtering, for each of the respective imaging pixels, the signals output by the imaging pixel and outputting filtered pulse signals that correspond to the pulse signals;
    receiving output of the filtering associated with at least two of the respective imaging pixels;
    changing between a charged state and an uncharged state of a storage device corresponding to a pulse being received from any of the at least two imaging pixels based on the received output of the filtering; and
    reading out a current state of the storage device.

21. The method of claim 20, wherein a stored charge is output in response to a single row selection pulse.

22. The method of claim 20, wherein a stored charge is reset to a predetermined state in response to a reset signal.

23. The method of claim 20, further comprising amplifying the output pulse signals output from the respective imaging pixels, wherein respective amplifications are performed in parallel to one another.

24. The method of claim 20, wherein the output of the filtering associated with at least two of the respective imaging pixels is received via a single node.

* * * * *